United States Patent [19]

Bakeman, Jr. et al.

[11] Patent Number: 4,622,573
[45] Date of Patent: Nov. 11, 1986

[54] CMOS CONTACTING STRUCTURE HAVING DEGENERATIVELY DOPED REGIONS FOR THE PREVENTION OF LATCH-UP

[75] Inventors: Paul E. Bakeman, Jr., Shelburne; Henry J. Geipel, Jr., Essex Junction, both of Vt.

[73] Assignee: International Business Machines Corporation, Armonk, N.Y.

[21] Appl. No.: 831,098

[22] Filed: Feb. 18, 1986

Related U.S. Application Data

[63] Continuation of Ser. No. 481,023, Mar. 31, 1983, abandoned.

[51] Int. Cl.$^4$ .................. H01L 29/78; H01L 29/88
[52] U.S. Cl. ........................ 357/42; 357/12; 357/41; 357/86
[58] Field of Search .............. 357/12, 42, 41, 86

[56] References Cited

U.S. PATENT DOCUMENTS

| | | | |
|---|---|---|---|
| 3,211,921 | 10/1965 | Kaufman et al. | 307/88.5 |
| 3,234,400 | 2/1966 | Hart | 307/88.5 |
| 3,434,023 | 3/1969 | Lesk | 357/12 |
| 3,641,403 | 2/1972 | Nakata | 357/12 |
| 3,943,554 | 3/1976 | Russell et al. | 357/12 |
| 4,035,826 | 7/1977 | Morton et al. | 357/42 |
| 4,167,747 | 9/1979 | Satou et al. | 357/42 |
| 4,318,750 | 3/1982 | Rai-Choudhury et al. | 148/1.5 |
| 4,327,368 | 4/1982 | Uchida | 357/42 |

FOREIGN PATENT DOCUMENTS

56-85851 7/1981 Japan .................. 357/42

OTHER PUBLICATIONS

B. L. Gregory et al, entitled "Latch-up in CMOS Integrated Circuits", published in IEEE Trans. Nu. Sci., NS-20, No. 6, pp. 293-299, Dec. 73.
R. S. Payne et al, entitled "Elimination of Latch-up in Bulk CMOS", publ. in Tech. Digest for Intern. Electron Devices Meeting Dec. '80.
M. Sugino et al, "CMOS Latch-up Elimination Using Schtotky . . . ", IEDM 1982, pp. 462-465.
Richard Dalven, "Introduction to Solid State Physics", 1980, pp. 96-101.
Helmut F. Wolf, "Semiconductors", 1972, pp. 59-69.

*Primary Examiner*—William D. Larkins
*Assistant Examiner*—Charles S. Small, Jr.
*Attorney, Agent, or Firm*—Mark F. Chadurjian; George Tacticos

[57] ABSTRACT

A contact structure suitable for use in a CMOS device to prevent or suppress the latch-up phenomenon in the device. It uses two degeneratively doped regions of different conductivity type with a tunnel injecting interface therebetween and a conductive segment contiguous to one of the two regions. Using such a structure as the source of an FET in a CMOS arrangement causes the emitter area and the base spreading resistance of the corresponding parasitic bipolar transistor to be reduced. This in turn causes the current gain of the parasitic transistor to decrease and the latch-up phenomenon to be prevented or suppressed.

7 Claims, 8 Drawing Figures

CMOS CONTACTING STRUCTURE HAVING DEGENERATIVELY DOPED REGIONS FOR THE PREVENTION OF LATCH-UP

This is a continuation of co-pending application Ser. No. 481,023 filed on Mar. 31, 1983, now abandoned.

DESCRIPTION

1. Technical Field

This invention relates in general to semiconductor contact structures and to integrated circuits using them. More particularly, it relates to a new contact structure suitable for use in a source region of a field effect transistor connected in a complementary type MOS ("CMOS") circuit arrangement to prevent latch-up in the device.

2. Background Art

CMOS circuits are preferred for many applications for, among other advantages, their low power dissipation. They use a combination of N-channel and P-channel MOS transistors monolithically constructed on the same substrate in a circuit arrangement that consumes no DC power. They consume significant power only during AC switching with their power use increasing with the operating frequency. However, the expansion of applications of CMOS circuits in bulk silicon substrates has been hindered to a certain extent by the susceptibility of CMOS circuits to an effect which is known as the latch-up effect, which is due to the SCR action of the parasitic bipolar transistors inherent in CMOS structures constructed in bulk silicon. For example, in a CMOS circuit having a P-channel Field Effect Transistor ("FET") and an N-channel FET constructed in a P-type substrate and having the P-channel FET in an N-type well region there is a vertical parasitic PNP transistor and a lateral parasitic NPN transistor. Under certain excitation conditions, the two interconnected parasitic bipolar transistors are triggered to act in combination like a PNPN structure creating a low resistance path between the positively biased source of the P-channel device and the negatively biased or grounded source of the N-channel device. The potentially large currents that can flow through this path can cause the destruction of the CMOS structure. The causes and effects of latch-up have been the subject of many technical articles and several solutions have been suggested for eliminating or reducing the effects of latch-up.

Since this latch-up phenomenon cannot take place if the current gain product of the two parasitic transistors is less than 1, most solutions to this problem involve schemes for reducing the current gains of the parasitic bipolar transistors.

In an article by B. L. Gregory and B. D. Shafer entitled "Latch-Up in CMOS Integrated Circuits," published in IEEE Trans. Nuc. Sci., NS-20, No. 6, pp. 293–299, December 1973, there are three suggested techniques for eliminating or reducing the effects of latch-up. They include the reduction of the lifetime of the minority carriers in the CMOS structure, variations in circuit layout, and variations in CMOS processing to reduce the current gain product of the parasitic transistors to less than 1. In an article by R. S. Payne, W. N. Grant and W. J. Bertram, entitled "Elimination of Latch-Up in Bulk CMOS," published in the Technical Digest for the International Electron Devices Meeting in December 1980 in Washington, D.C., there is a discussion on the use of an N on a N+ epitaxial layer starting material to reduce the substrate resistance to a level which would preclude a sustained SCR action. In U.S. Pat. No. 4,318,750, issued on Mar. 9, 1982, to Rai-Choudhury et al, there is a discussion of a technique for eliminating the latch-up by irradiating the circuit with high energy ions to provide low lifetime regions for lowering the gains of the parasitic transistors. In U.S. Pat. No. 4,327,368, issued on Apr. 27, 1982, to Uchida, there is described a CMOS structure which is fabricated on a semiconductor layer which layer forms with a supporting semiconductor body a PN junction. This PN junction is reversed biased during operation to suppress the latch-up phenomenon. In an article by M. Sugino, L. A. Akers and M. E. Rebeschini, entitled "CMOS Latch-Up Elimination Using Schottky Barrier PMOS," published in IEDM 1982 pp. 462–465 the CMOS structure uses Schottky barrier junctions for the source and drain of the P-channel transistor to eliminate the PNPN structure. The Schottky barriers are used to provide a low minority carrier injection into the MOSFET inversion layer which results in a lower gain for the parasitic bipolar transistors. Among the limitations of this structure is low P-channel FET gain resulting from the offset of the source and drain junctions from the gate electrode.

The approaches described above represent efforts to reduce the effectiveness of latch-up in CMOS devices. Our present invention extends the developments in this area of technology while eliminating many of the disadvantages and limitations of prior art structures and offering many further advances and flexibilities. For example, simplicity and compatibility with existing conventional processes and CMOS circuits.

DISCLOSURE OF INVENTION

The general purpose of this invention is to provide means for preventing the latch-up effect in semiconductor devices having complementary type CMOS transistors which are feasible to manufacture using current processing techniques.

To accomplish this purpose, we have provided a new semiconductor contact structure which, when incorporated in a CMOS circuit, lowers the gain product of its parasitic bipolar transistors. Our new semiconductor contact structure includes in a semiconductor layer of a first conductivity type, a degeneratively doped region of a first conductivity type and a second degeneratively doped region of a second conductivity type contiguously disposed to the first region so as to form a tunnel injecting interface between the two regions. It also has electrically conductive means contiguous to at least one of the two degeneratively doped regions. Such a contact is designed to connect two semiconductor regions of a different conductivity type to substantially the same potential level with one connection to a power source terminal.

Thus, in one embodiment of this invention, the new contact structure can be made by forming in a N-type semiconductor layer a first degeneratively doped region P++, and a second degeneratively doped layer N++ contiguous to the first region establishing a structure wherein under the proper biasing conditions charges can transfer from one region to the other as if the two opposite conductivity regions were an ohmic resistor of a relatively low absolute resistance value. For example, the two regions may form a P++N++ junction tunnel diode wherein under the proper biasing conditions with a very low voltage applied across the diode (in either forward or reverse biasing direction) charges will move across the junction from one region to the other by tunneling. When such a structure is used in the source of one or both transistors of a CMOS device it reduces the base spreading resistance of the parasitic bipolar transistor(s) and reduces their current gain product which in turn reduces the likelihood of latch-up for the device.

A CMOS device may be made having two complementary type FET's monolithically constructed in the same semiconductor body. One of these FET's is inside a well region which in turn is inside the semiconductor body and has a conductivity opposite to that of this body. Each FET has source, channel and drain regions and one of the two source regions is degeneratively doped. Contiguously disposed to this degeneratively doped source region is a degeneratively doped contact region having a conductivity type opposite to that of the degeneratively doped source region. A CMOS circuit can also be made, in accordance with the teachings of this invention, to have both source regions degeneratively doped and to have degeneratively doped contact regions contiguously disposed to both source regions.

Accordingly, it is an object of this invention to provide a new and improved semiconductor contact structure for connecting two semiconductor regions of opposite conductivity to substantially the same potential using one connection to a power source terminal.

It is another object of this invention to provide a contact structure which can be used in the source region of one or both of the CMOS transistors to prevent the latch-up effect in the CMOS structure.

These and other objects of the invention will become more fully apparent in the following description of the accompanying drawings.

DETAILED DESCRIPTION OF THE DRAWINGS

Figure 1:
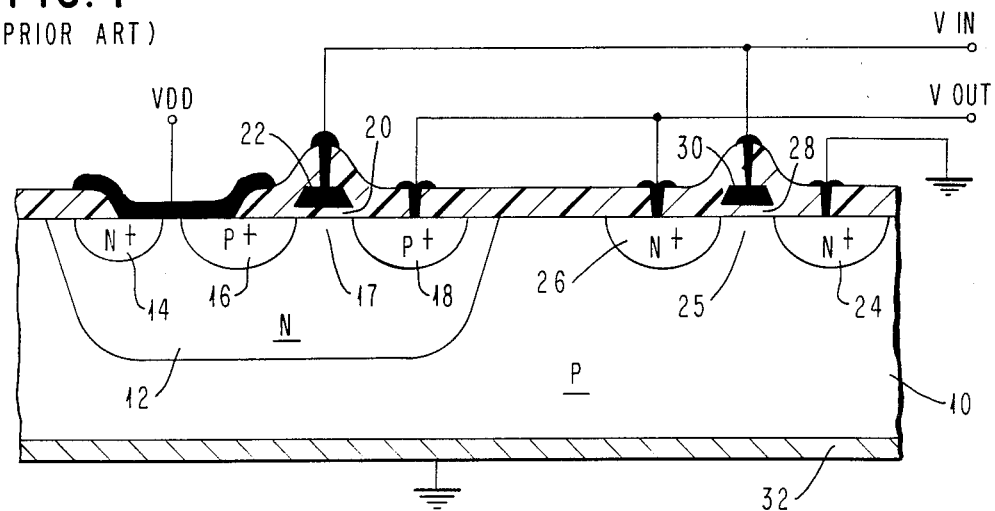
FIG. 1 is a diagrammatic cross-sectional view of a prior art CMOS device.

Referring now to FIG. 1, there is shown a diagrammatic cross-sectional view of a prior art CMOS device. It includes a silicon layer 10 having a P-type conductivity, a well region 12 with an N-type conductivity, an N+ contact region 14 in the well region 12 and an adjacent P+ source region 16. The first FET transistor of the device in the N-type well region, is a P-channel FET having source region 16, channel region 17, drain region 18, an insulating layer 20, and a gate electrode 22. The second FET is outside the well region but in the same layer 10. It is an N-channel FET and has source region 24, channel region 25, drain region 26, insulating layer 28 and gate electrode 30. The N+ contact region 14 and the P+ source region 16 are connected with a metal conductor which is in direct contact with both regions, to a power source terminal VDD. The voltage applied to that terminal is typically 5 to 10 volts. The gate electrodes 22 and 30 are commonly connected to input terminal V IN and the P+ region 18 and the N+ region 26 are commonly connected to an output terminal V OUT. The N+ source region 24 is connected to a ground terminal or can be connected to some other preselected reference power source. The substrate 10 is connected through a contact region 32 to a terminal which can be grounded or set at a slightly negative bias potential.

Figure 2:
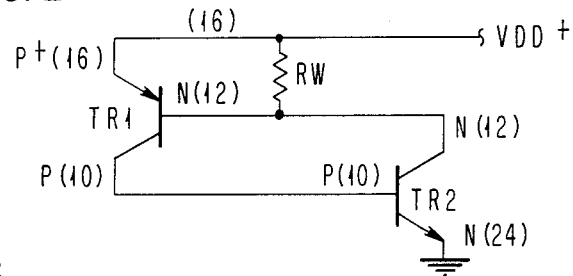
FIG. 2 is an equivalent circuit of the parasitic bipolar transistors inherent in the CMOS structure shown in FIG. 1.

Referring now to FIG. 2, there is shown the equivalent circuit of the parasitic bipolar transistor circuit inherent in the device shown in FIG. 1. The circuit includes a PNP transistor TR1, an NPN transistor TR2 and a resistor RW which represents the resistance between the emitter 16 and the base, as represented by regions 14 and 12. In certain prior art devices the N+ contact region 14 and the P+ source region 16 are made contiguous to each other to short out the base emitter junction of the PNP transistor. However, even in these devices there will still be some lateral resistance in the base region (well region 12), which at high injections can cause the current gain product of the two parasitic transistors to exceed 1. In addition, devices having contact regions adjacent to source regions and making contacts to both regions are more difficult to make because they require two high level diffusions, one for the formation of an N+ region and the other for the formation of the P+ region and then they require two contacts to be made to the VDD terminal line with at least one alignment between the two contacts.

Figure 3:
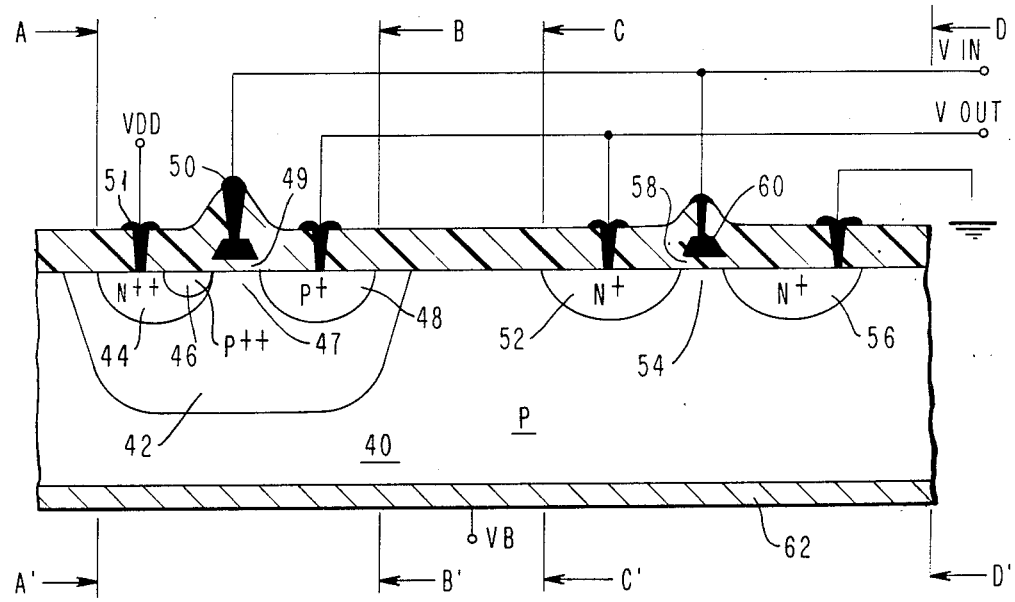
FIG. 3 is a diagrammatic cross-sectional view of a semiconductor device embodying the invention.
Figure 4:
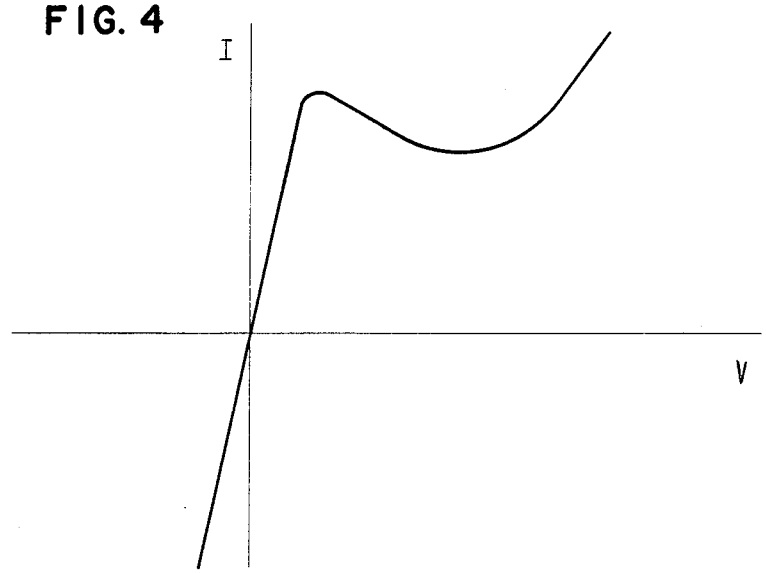
FIG. 4 is an illustration of the voltage-current characteristics of tunnel diodes such as the one included in the device shown in FIG. 3.

Referring now to FIG. 3, there is shown a CMOS device constructed in accordance with the teachings of the present invention. It includes a P-type silicon body 40 having a doping concentration on the order of $10^{15}$ dopant atoms/cm$^3$, an N-type well region 42 having a doping concentration close to the surface in the range between $1 \times 10^{16}$ dopant atoms/cm$^3$ to $2 \times 10^{16}$ dopant atoms/cm$^3$, an N++ contact region 44, a P++ region 46 and a P+ region 48 for the P-channel transistor's source and drain regions, respectively, a channel region 47, a gate dielectric 49, a gate electrode 50. Electrical conductive means 51, such as a metal contact, connect the contact region 44 to a power supply terminal VDD. The source region 46 is formed in the N++ contact region through a very heavy doping of a preselected portion of the N++ contact region to overcompensate the N++ and convert it into a P++ region which is connected to a terminal line for application of a source bias potential. The doping of the N++ contact region 44 and the P++ region 46 is done as to create a P++N++ junction tunnel diode in the source region of the transistor. These types of diodes differ from conventional PN diodes by having much higher doping concentrations on both sides of the PN junction which gives them much higher conductivity within a small biasing range in either forward or reverse biasing direction. As the forward biasing is increased these diodes will exhibit a negative resistance within a certain biasing range and then as the forward biasing is increased the diode will exhibit the normal PN junction characteristics. A particular tunnel diode's exact characteristics depend on, among other factors, the semiconductor material from which the device was made. For a PN junction to have these types of charactersitics it is necessary for both sides of the diode to be degeneratively doped. For example, doping concentrations in silicon for degeneratively doped regions 44 and 46 should be in excess of $1.8 \times 10^{19}$ dopant atoms/cm$^3$. Descriptions of tunnel diode characteristics can be found in many textbooks, such as in "Introduction to Applied Solid State Physics" by Richard Darvin, published by Plenum Press in 1980. In pages 96 through 101 there is a discussion of tunnel diodes and the behavior of degenerate PN junctions under differing bias conditions. Furthermore, in a book by Helmut F. Wolf, entitled "Semiconductors" which was published by Wiley-Interscience in 1972, there is a chapter untitled "Degenerate and Nondegenerate Semiconductors" which describes the behavior of semiconductor materials at different doping levels. Thus, at the application of a small forward bias, electron energy states in the conductance band on the N++ side of the P++N++ junction reach the same energy level as vacant energy states in the valence band on the P++ side which increases the probability of electrons "tunneling through" the junction barrier. As the forward bias applied across the P++N++ junction increases, the overlap of the N++ conduction band and the P++ valance band disappears and minority carriers are injected across the junction giving rise to the normal PN junction characteristics as indicated in the curve shown in FIG. 4. During reverse biasing of the junction, holes will tunnel from the N++ side of the diode to the P++ side and electrons from the P++ side to the N++ side, creating a low impedance across the diode. This impedance is relatively low compared to the channel impedance of the P-channel transistor and will not affect the performance of the P-channel FET. However, the P++N++ diode shown in the structure of FIG. 3 is designed to have an injection efficiency for holes into the N well 42 which is extremely low by making the area of P++ region 46 relatively small and by keeping the bias potential at the N++ region 44 slightly higher than in the P++ region. The tunnel diodes formed in contact structures made in accordance with the teachings of this invention are biased to operate in the linear portions of their operating characteristics shown in FIG. 4.

The remaining parts of the device shown in FIG. 3 are made through conventional processing techniques. The P-channel FET in the N-well region includes the P++ region 46 mentioned above as the source, region 47 as the channel, region 48 as the drain, region 49 as the gate dielectric and region 50 as the gate electrode. The N-channel FET includes source region 56, channel region 54, drain region 52, gate dielectric region 58, and gate electrode 60. The drain region 48 of the P-channel FET and the drain region 52 of the N-channel FET are each connected through ohmic contact means to drain terminals which are commonly connected to an output terminal V OUT. The gate electrodes 50 and 60 of the two FET's are commonly connected to an input terminal V IN. The source region 56 of the N-channel FET is typically connected through ohmic contact means to ground. The N++ contact region 44 is connected through an ohmic contact 51 to a power source terminal VDD. The substrate 40 is connected through a contact region 62 to terminal VB which is set either at ground or at a negative potential, typically in the range of $-1$ to $-3$ volts. VDD can be set to a potential of approximately 5 volts and during the operation of the P-channel transistor the P++ source region will reach a slightly lower potential of about 4.95 to 4.90 volts so that the potential difference between the two will be less than 100 millivolts with the source region 46 at the lower potential.

The equivalent circuit shown in FIG. 2 represents the parasitic circuits of both the device of FIG. 1 and the device of FIG. 3. However, the parasitic SCR is effectively eliminated from the device shown in FIG. 3, because of the special construction of the source region of this device. The latch-up phenomenon takes place when the parasitic TR1 and TR2 are both conductive and they form a PNPN type structure. In the case of the device in FIG. 3, this PNPN structure should be through P++ source region 46, N-well region 42, P-type substrate 40 and N+ source region 56. However, in the device of FIG. 3, the P++ source region 46 which is also the emitter of the bipolar transistor TR1 has been cut down in size to reduce to current gain of TR1. Furthermore, by having regions 44 and 46 degeneratively doped with the N++ contact region 44 at the same or slightly higher potential than the P++ source region 46, the base spreading resistance RW will be substantially lower. This causes the current gain of TR1 to be reduced and the parasitic SCR is effectively eliminated.

Figure 5A:
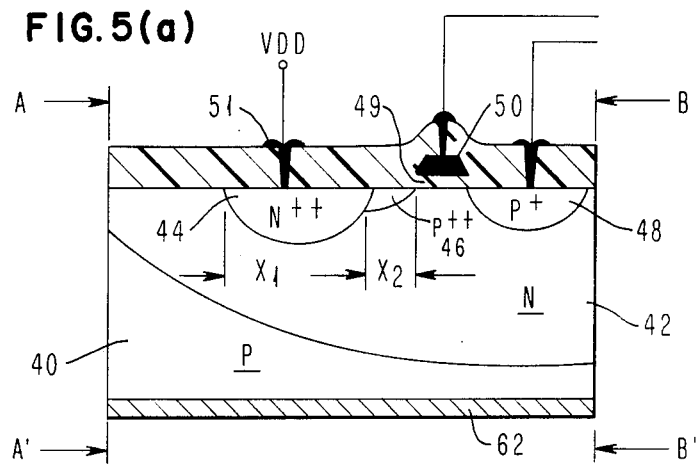
FIGS. 5a–5c are diagrammatic cross-sectional views of alternative contact structures that can be used for CMOS devices embodying the invention.
Figure 5B:
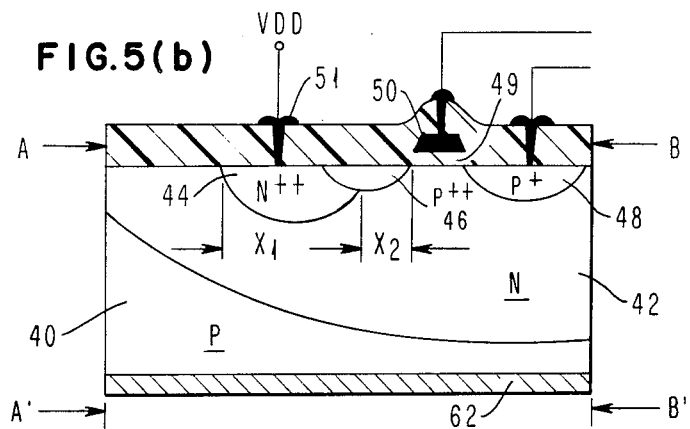
Figure 5C:
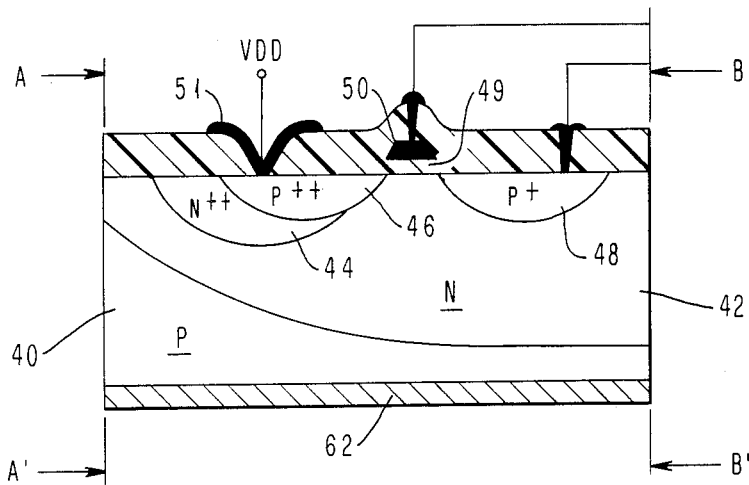

Referring now to FIGS. 5a-5c, there are shown alternative tunnel injectors formed by altering the relative position and size of the N++ contact region and the P++ source region. These are alternative structures to the structure shown in FIG. 3 between lines AA' and BB'. In both FIG. 5a and FIG. 5b the length of the source region $X_2$ should be less than the length $X_1$ of the contact region in order to minimize the size of the source region and thus the size of the emitter of the parasitic transistor which minimizes the injection efficiency of holes from the source region into the N well region. Any one of these structures shown with an FET having a contact structure in accordance with the teachings of this invention can be used either as part of a CMOS arrangement or separately.

Figure 6:
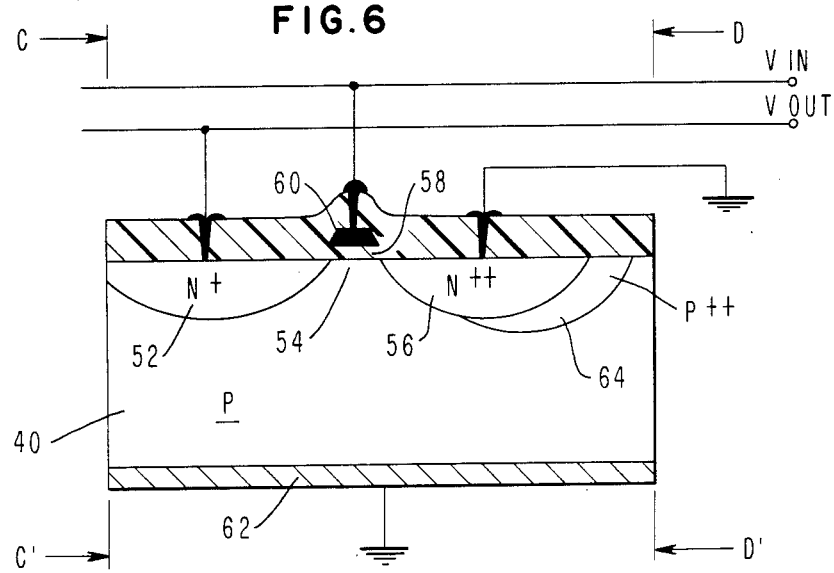
FIG. 6 is a diagrammatic cross-sectional view of a portion of yet another structure that can be used with CMOS devices embodying the invention.

Referring now to FIG. 6, there is shown another alternative structure to that shown in FIG. 3 between lines CC' and DD'. This shows the N-channel transistor of the CMOS shown in FIG. 3 with a contact structure in accordance with the teachings of this invention at its source region 56. Region 56 is a N++ degeneratively doped region and region 64 is a P++ degeneratively doped region. If this structure is used in the device of FIG. 3 then contact region 62 must be connected to ground.

While the invention has been described in connection with preferred embodiments, it will be understood that it is not intended to limit the invention to those embodiments described and shown in the drawings. On the contrary, it is intended to cover all alternatives, modifications and equivalents, as may be included within the spirit and scope of the invention as defined by the appended claims.

What is claimed is:
1. A field effect transistor structure comprising:
(a) a semiconductor layer including a channel region of a first conductivity type interposed between drain and source regions of a second conductivity type wherein said source region is a degeneratively doped region;
(b) a degeneratively doped contact region of a second conductivity type disposed contiguous to and surrounding said source region outside said channel region, said contact region having an area which is larger than that of said source region, said source region and said contact region forming a tunnel diode which prevents formation of a parasitic bipolar device;

(c) an insulating layer disposed over said channel region;

(d) an electrically conductive layer disposed over said insulating layer to form the gate electrode of said transistor;

(e) electrically conductive means in direct contact with only said contact region to form a terminal for both said source and said contact regions; and (f) electrically conductive means in contact with said drain region.

2. A semiconductor structure comprising:
at least one FET, with a first FET including a channel region of a first conductivity type interposed between source and drain regions of a second conductivity type formed in a semiconductor layer of a first conductivity type, wherein said source region is a degeneratively doped region, a gate electrode adjacent to and insulated from said channel region by a gate dielectric layer, a degeneratively doped contact region of a first conductivity type contiguously disposed to said source region outside said channel region, said contact region having a lateral length which is greater than that of said source region, said source region and said contact region forming a degenerate PN junction therebetween, whereby under the appropriate biasing conditions charges can transfer across said junction by tunneling to prevent formation of a parasitic bopolar device, ohmic contact means on only one of said source and contact regions for electrically connecting both source and contact regions to a power source terminal and ohmic contact means for electrically connecting said drain region to a drain terminal.

3. A semiconductor structure as set forth in claim 2 wherein said semiconductor layer of a first conductivity layer is a well region of a semiconductor body of a second conductivity type.

4. A semiconductor structure as set forth in claim 3, which further includes: a second FET complementary to said first FET with said second FET having a channel region of a second conductivity type interposed between source and drain regions of a first conductivity type formed in a predetermined portion of said semiconductor body outside said well region, a gate electrode adjacent said semiconductor region and spatially disposed over said channel region and insulated from said semiconductor region by a gate dielectric layer; means for interconnecting said first FET and said second FET to form a CMOS circuit arrangement; means for biasing said first FET including said power source terminal, said second FET and said semiconductor body to cause charges to move across said degenerate junction by tunneling and thereby preventing latch-up in the structure.

5. A semiconductor structure as set forth in claim 4 wherein said source region of said second FET is a degeneratively doped region of a second conductivity type and said semiconductor structure further includes a degeneratively doped contact region of a first conductivity type contiguously disposed to and surrounding said source region of said second FET outside said channel region of said second FET, said contact region of said second FET having an area which is larger than that of said source region of said second FET, so as to form a degenerate junction therebetween.

6. An improved CMOS integrated circuit of the type having two complementary type FET's monolithically constructed in a semiconductor body of a given conductivity type, with one FET formed in a well region in said semiconductor body having a conductivity opposite to that of said semiconductor body and with each FET having source, channel and drain regions, characterized in that one of said FET source regions is a degeneratively doped region, and contiguously disposed to said degeneratively doped source region outside said channel region is a degeneratively doped contact region having a conductivity type opposite to that of said degeneratively doped source region, said contact region having an area which is larger than that of said source region, so that under the proper biasing conditions charges can transfer between said degeneratively doped source and contact regions by tunneling when said degeneratively doped contact region is brought to a potential which is no more than approximately 100 millivolts above that of said degeneratively doped source region by a connection from said degeneratively doped contact region to a power supply terminal.

7. A semiconductor device comprising:
a semiconductor body of a first conductivity type;
a well region of a second conductivity type formed in said semiconductor body;
a first semiconductor region of a first conductivity type formed in said well region;
a second degeneratively doped semiconductor region of a second conductivity type and a third degeneratively doped semiconductor region of a first conductivity type forming a junction tunnel diode in said well region, said third degeneratively doped semiconductor region and said first semiconductor region defining a channel region therebetween, said second degeneratively doped semiconductor region contiguously disposed to and surrounding said third degeneratively doped semiconductor region outside said channel region, said second degeneratively doped semiconductor region having an area which is larger than said third degeneratively doped semiconductor region;
a first insulating layer disposed above said channel region of said semiconductor body;
a first gate electrode disposed above said first insulating layer forming with said first insulating layer and said first and third semiconductor regions a first FET;
fourth and fifth semiconductor regions of a second donductivity type formed in a surface area of said semiconductor body;
a second insulating layer disposed adjacent said substrate and between said fourth and fifth semiconductor regions;
a second gate electrode disposed adjacent said second insulating layer and said fourth and fifth semiconductor regions a second FET
means for interconnecting said first and second FET's to form a CMOS circuit arrangement;
means for biasing said junction tunnel diode such that said second degeneratively doped semiconductor region is at a potential of no more than 100 millivolts in excess of that of said third degeneratively doped semiconductor region, in order to operate said tunnel diode as a low absolute value ohmic resistor to prevent latch-up of said CMOS circuit arrangement.

* * * * *